United States Patent
Lee et al.

(10) Patent No.: US 10,664,005 B2
(45) Date of Patent: May 26, 2020

(54) SYSTEM AND METHOD FOR DETECTING CLOCK FREQUENCY OFFSET OF FAN CHIP

(71) Applicant: Sentelic Corporation, Taipei (TW)

(72) Inventors: Wen-Ting Lee, Taipei (TW);
Chung-Chih Fang, Taipei (TW);
Li-Wei Lin, Taipei (TW)

(73) Assignee: Sentelic Corporation, Taipei (TW)

( * ) Notice: Subject to any disclaimer, the term of this patent is extended or adjusted under 35 U.S.C. 154(b) by 163 days.

(21) Appl. No.: 15/962,936

(22) Filed: Apr. 25, 2018

(65) Prior Publication Data

US 2019/0179359 A1 Jun. 13, 2019

(30) Foreign Application Priority Data

Dec. 7, 2017 (TW) .............................. 106143003 A

(51) Int. Cl.
*G06F 1/04* (2006.01)
*H03K 5/156* (2006.01)
*H05K 7/20* (2006.01)
*G05B 19/042* (2006.01)
*H03K 5/26* (2006.01)
*G06F 1/20* (2006.01)

(52) U.S. Cl.
CPC .............. *G06F 1/04* (2013.01); *G05B 19/042* (2013.01); *H03K 5/1565* (2013.01); *H03K 5/26* (2013.01); *H05K 7/20209* (2013.01); *G06F 1/206* (2013.01)

(58) Field of Classification Search
CPC .... H05K 7/20209; H03K 5/26; H03K 5/1565; G06F 1/04; G06F 1/206; G05B 19/042
See application file for complete search history.

(56) References Cited

U.S. PATENT DOCUMENTS

| | | | | |
|---|---|---|---|---|
| 6,121,747 A | * | 9/2000 | Trachtenberg | H02P 23/186 318/600 |
| 6,737,860 B2 | * | 5/2004 | Hsu | H05K 7/20209 324/161 |
| 6,765,422 B1 | * | 7/2004 | Aslan | H02P 7/29 327/124 |
| 7,151,349 B1 | * | 12/2006 | Williamson | H02P 6/08 318/400.37 |
| 7,863,849 B2 | * | 1/2011 | McLeod | H02P 7/285 318/268 |
| 7,949,234 B2 | * | 5/2011 | Harashima | H02P 7/29 318/400.06 |

(Continued)

*Primary Examiner* — Glenn A. Auve
(74) *Attorney, Agent, or Firm* — CKC & Partners Co., LLC

(57) ABSTRACT

The invention provides a system and method for detecting clock frequency offset of fan chip. The system comprises a fan chip and a control unit. A target pulse width is defined in the fan chip and the control unit. When the control unit executes a detection process of clock frequency offset for the fan chip, it will generate a specific pattern pulse signal and send the specific pattern pulse signal to the fan chip. The fan chip enters a detection mode of clock frequency offset according to the specific pattern pulse signal, generates a response signal including an actual target pulse width based on referring to the defined target pulse width, and send the response signal to the control unit. The control unit compares a difference between the actual target pulse width and the defined target pulse width to detect a clock frequency offset value of the fan chip.

10 Claims, 2 Drawing Sheets

(56) References Cited

U.S. PATENT DOCUMENTS

| | | | | |
|---|---|---|---|---|
| 8,035,333 B2 * | 10/2011 | Yoshitomi | ............ | H02P 7/2913 318/400.06 |
| 8,241,008 B2 * | 8/2012 | Tsai | ............ | F04D 27/00 417/22 |
| 8,552,677 B2 * | 10/2013 | Tang | ............ | H02P 6/14 318/400.11 |
| 2012/0150469 A1 * | 6/2012 | Welter | ............ | F04D 27/001 702/77 |

* cited by examiner

SYSTEM AND METHOD FOR DETECTING CLOCK FREQUENCY OFFSET OF FAN CHIP

This non-provisional application claims priority claim under 35 U.S.C. § 119 (a) on Taiwan Patent Application No. 106143003 filed Dec. 7, 2017, the entire contents of which are incorporated herein by reference.

FIELD OF THE INVENTION

The present invention relates to a detection system and method, more particularly, to a detection system and method of clock frequency offset for fan chip.

BACKGROUND

With the quick development of science and technology, the electronic device can be given more functionality to enhance the cost performance ratio of the electronic device. The electronic device having multi-function usually need to be configured more electronic components inside thereof. These electronic components increase not only the circuit density of the electronic device, but also the operating temperature of the electronic device. In order to avoid that the electronic device is overheating during the operation, the electronic device will be usually provided with a fan inside thereof. The electronic device in operating can be dissipated heat by the rotation of the fan. The operation of the fan is controlled by a fan chip so that the fan in operation is able to reach the required rotational speed.

In the production process of fan chip, the clock frequency of the fan chip would often generate offset because various factors on the production. The controlling for the fan will occur errors and inaccuracies due to the clock frequency offset of the fan chip, resulting in the rotational speed of the fan to not reach the required rotational speed, such that it is detrimental to the operation of the electronic device.

For the above reason, the present invention provides a means capable of detecting the clock frequency offset of the fan chip, which can detect a clock frequency offset value of the fan chip; afterwards, frequency parameters inside the fan chip can be adjusted according to the detected clock frequency offset value, so that the fan chip can accurately control the operation of the fan, it will be the objective of the present invention.

SUMMARY

It is one objective of the present invention to provide a system for detecting clock frequency offset of fan chip, wherein the detection system can execute a detection process of clock frequency offset for the fan chip, so as to detect a clock frequency offset value of the fan chip; then, the detection system can adjust the internal frequency parameters set in the fan chip based on the clock frequency offset value so that the internal clock frequency of the fan chip can be consistent with the defined target clock frequency; afterwards, when the fan chip is operated in a fan operation mode, the frequency of the control command sent from the fan chip will conform to the original target frequency, and thus the fan chip can accurately control the fan to be operated in a predetermined rotational speed.

To achieve the above object, the present invention provides a system for detecting clock frequency offset of fan chip, comprising: a fan chip comprising an input pin and an output pin; a control unit connected to the fan chip, wherein a target pulse width is defined in the fan chip and the control unit, respectively; wherein when the control unit wants to execute a detection process of clock frequency offset for the fan chip, the control unit will generate a specific pattern pulse signal, and send the specific pattern pulse signal to the fan chip; the fan chip receives the specific pattern pulse signal via the input pin to enter a detection mode of clock frequency offset; when the fan chip is operated in the detection mode of clock frequency offset, the fan chip will generate a response signal including an actual target pulse width based on referring to the defined target pulse width, and send the response signal to the control unit via the output pin; afterwards, the control unit compares a difference between the actual target pulse width in the response signal and the defined target pulse width so as to detect a clock frequency offset value of the fan chip.

In one embodiment of the present invention, the specific pattern pulse signal is formulated with a specific number of pulses and a specific duty ratio of pulse.

In one embodiment of the present invention, the fan chip comprises a first firmware, the control unit comprises a second firmware, the target pulse width is defined in the first firmware of the fan chip and the second firmware of the control unit, respectively.

In one embodiment of the present invention, the fan chip comprises a first storage unit, the control unit comprises a second storage unit, the target pulse width is defined in the first storage unit of the fan chip and the second storage unit of the control unit, respectively.

In one embodiment of the present invention, when the control unit wants to execute a fan operation process for the fan chip, the control unit will generate a fan operation pulse signal and send the fan operation pulse signal to the fan chip, the fan chip receives the fan operation pulse signal via the input pin to enter a fan operation mode according to the fan operation pulse signal; when the fan chip is operated in the fan operation mode, the fan chip will generate a corresponding control command that indicates a rotation speed according to a duty ratio of each of pulses in the fan operation pulse signal, and send each of the control commands to a fan by the output pin in sequence so that the fan is able to be operated in a predetermined rotation speed by the controlling of each of the control commands.

In one embodiment of the present invention, the fan chip comprises a first firmware or a comparison circuit, when the fan chip receives a pulse signal sent from the control unit, it will determine that the pulse signal is the fan operation pulse signal or the specific pattern pulse signal by the first firmware or the comparison circuit, and therefore decide to be operated in the fan operation mode or the detection mode of clock frequency offset.

In one embodiment of the present invention, the control unit is a controller, a processor, or a BIOS.

The present invention further provides a method for detecting clock frequency offset of fan chip, comprising: defining a target pulse width in a fan chip and a control unit; and executing a detection process of clock frequency offset for the fan chip by the control unit, steps of the detection process of clock frequency offset comprising: generating a specific pattern pulse signal and sending the specific pattern pulse signal to the fan chip by the control unit; receiving the first pulse signal by the fan chip; enabling the fan chip to be operated in a detection mode of clock frequency offset according to the specific pattern pulse signal; enabling the fan chip to generate a response signal including an actual target pulse width based on referring to the defined target pulse width, and send the response signal to the control unit; and detecting a clock frequency offset value of the fan chip by the control unit comparing a difference between the actual target pulse width in the response signal and the defined target pulse width.

In one embodiment of the present invention, wherein the control unit can further execute a fan operation process for the fan chip, steps of the fan operation process comprising: generating a fan operation pulse signal and sending the fan operation pulse signal to the fan chip by the control unit; enabling the fan chip to enter a fan operation mode when it receives the fan operation pulse signal; and enabling the fan chip to generate a corresponding control command that indicates a rotation speed according to a duty ratio of each of pulses in the fan operation pulse signal, and send each of the control commands to a fan so that the fan is able to be operated in a predetermined rotation speed by the controlling of each of the control commands.

In one embodiment of the present invention, wherein the fan chip comprises a first firmware or a comparison circuit, the steps of the method further comprising: receiving a pulse signal sent from the control unit by the fan chip; and determining that the pulse signal is the fan operation pulse signal or the specific pattern pulse signal by the first firmware or the comparison circuit.

DETAILED DESCRIPTION OF THE PREFERRED EMBODIMENTS

Figure 1:
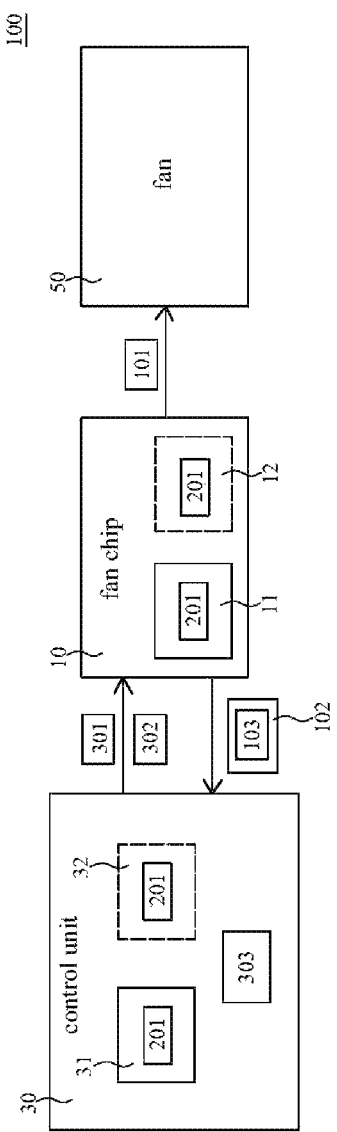
FIG. 1 is a circuit block diagram of a system for detecting clock frequency offset of fan chip according to one embodiment of the present invention.
Figure 2:
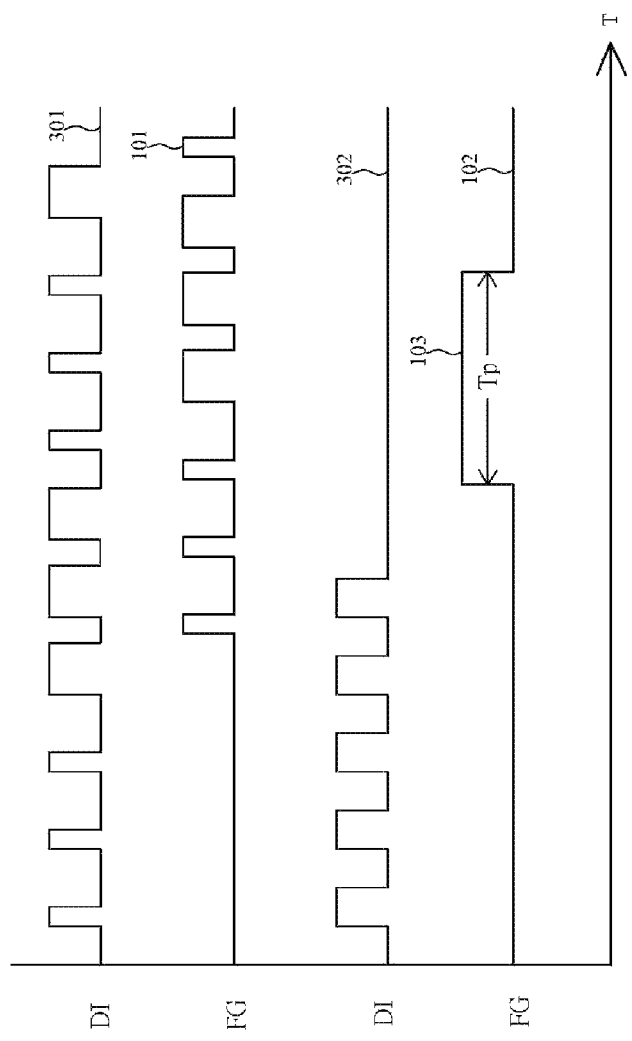
FIG. 2 is a signal waveform diagram of fan chip operated in a fan operation mode or a detection mode of clock frequency offset according to the present invention.

Referring to FIGS. 1 and 2, there are shown a circuit block diagram of a system for detecting clock frequency offset of fan chip according to one embodiment of the present invention, and a signal waveform diagram of fan chip operated in a fan operation mode or a detection mode of clock frequency offset according to the present invention. As shown in FIG. 1, the detection system 100 comprises a fan chip 10, a control unit 30, and a fan 50. The fan chip 10 is connected to the control unit 30 and the fan 50.

As the above background description, the clock frequency of the fan chip 10 would often generate offset due to various factors on the production in the production process of fan chip 10. The controlling for the fan 50 may occur errors or inaccuracies due to the clock frequency offset of the fan chip 10, resulting in the rotational speed of the fan 50 to not reach the required rotational speed. Therefore, the detection system 100 of the present invention will detect the clock frequency of the fan chip 10 to know whether the clock frequency offset is occurred in the fan chip 10.

The fan chip 10 comprises an input pin (DI), an output pin (FG), a power pin, and a ground pin. The control unit 30 may be a controller, a processor, or a BIOS (Basic Input/Output System), and used for deciding the operation mode (such as a fan operation mode or a detection mode of clock frequency offset) of the fan chip 10. In one embodiment of the present invention, the fan chip 10 comprises a first firmware 11, the control unit 30 comprises a second firmware 31, the detection system 100 of the present invention is able to define a target pulse width (Td) 201 into the first firmware 11 and the second firmware 31, respectively. In another embodiment of the present invention, the fan chip 10 comprises a first storage unit 12, the control unit 30 comprises a second storage unit 32, the detection system 100 of the present invention may also define the target pulse width (Td) 201 into the first storage unit 12 and the second first storage unit 32, respectively. The first storage unit 12 and the second storage unit 32 are non-volatile memories.

With referring to FIG. 2, further, when the control unit 30 wants to execute a fan operation process for the fan chip 10, it will generate a fan operation pulse signal 301, and send the fan operation pulse signal 301 to the fan chip 10. After the fan chip 10 receives the fan operation pulse signal 301 via the input pin (DI), it will enter a fan operation mode. When the fan chip 10 is operated in the fan operation mode, it will generate a corresponding control command 101 that indicates a rotation speed according to a duty ratio of each of pulses in the fan operation pulse signal 301, respectively, and send each of the control commands 101 to the fan 50. Thus, the fan 50 is able to be operated at a predetermined rotational speed by the request of each of the control commands 101.

On the contrary, when the control unit 30 wants to execute a detection process of clock frequency offset for the fan chip 10, it will generate a specific pattern pulse signal 302 and send the specific pattern pulse signal 302 to the fan chip 10. The specific pattern pulse signal 302 is a pulse signal for indicating the fan chip 10 to be operated in the detection mode of clock frequency offset. After the fan chip 10 receives the specific pattern pulse signal 302 via the input pin (DI), it will enter the operation of the detection mode of clock frequency offset. When the fan chip 10 is operating in the detection mode of clock frequency offset, it will generate a response signal 102 including an actual target pulse width (Tp) 103 based on referring to the defined target pulse width (Td) 201. If the clock frequency inside the fan chip 10 is shifted because various factors on the production, the actual target pulse width (Tp) 103 generated by the fan chip 10 will not be consistent with the target pulse width (Td) 201 of the detection system 100. Then, the fan chip 10 sends the response signal 102 to the control unit 30 via the output pin (FG). The control unit 30 compares a difference between the defined target pulse width (Td) 201 and the actual target pulse width (Tp) 103 in the response signal 102 so as to detect a clock frequency offset value (To=Td−Tp) 303 of the fan chip 10. Afterwards, the control unit 30 adjusts the internal frequency parameters (such as frequency parameters of the oscillator) of the fan chip 10 according to the clock frequency offset value 303. Taking an example as a description, the target pulse width (Td) 201 is defined as 10 ms, the actual target pulse width (Tp) 103 in the response signal 102 generated by the fan chip 10 is 9 ms, the control unit 30 will know that the internal clock frequency of the fan chip 10 is higher than the original target clock frequency of the detection system 100 according to the clock frequency offset value (To=10 ms−9 ms=+1 ms) 303, the internal frequency parameters of the fan chip 10 is necessary to be adjusted downward by the control unit 30 to make that the internal frequency parameters of the fan chip 10 can be consistent with the original target clock frequency of the detection system 100. Taking another example as a description, the target pulse width (Td) 201 is defined as 10 ms, the actual target pulse width (Tp) 103 in the response signal 102 generated by the fan chip 10 is 11 ms, the control unit 30 will know that the internal clock frequency of the fan chip 10 is lower than the original target clock frequency of the detection system 100 according to the clock frequency offset value (To=10 ms−11 ms=−1 ms) 303, the internal frequency parameters of the fan chip 10 is necessary to be adjusted upward by the control unit 30 to make that the internal frequency parameters of the fan chip 10 can be consistent with the original target clock frequency of the detection system 100.

Furthermore, the specific pattern pulse signal 302 of the present invention is formulated with a specific number of pulses and a specific duty ratio of pulse, for example, the specific pattern pulse signal 302 is having five pulses, in which the duty ratio of each of pulses is 50%. The specific pattern, formulated in the pulse signal 302, will be recorded in the first firmware 11. When the fan chip 10 receives a pulse signal sent from the control unit 30 via the input pin (DI), the first firmware 11 of the fan chip 10 determines whether the number of pulses and the duty ratio of pulse in the pulse signal sent from the control unit 30 are equal to the number of pulses and the duty ratio of pulse in the specific pattern pulse signal 302. If the first firmware 11 of the fan chip 10 determines that the number of pulses and the duty ratio of pulse in the pulse signal sent from the control unit 30 are equal to the number of pulses and the duty ratio of pulse in the specific pattern pulse signal 302, the fan chip 10 enters the detection mode of clock frequency offset, else the fan chip 10 enters the fan operation mode. In the present invention, the fan chip 10 can determine the pulse signal 301/302 sent from the control unit 30 in a way of firmware (such as the first firmware 11); of course, the fan chip 10 can also select to determine the pulse signal 301/302 sent from the control unit 30 in a way of hardware, for example, the hardware is a comparison circuit consisted of at least one comparator.

Accordingly, the detection system 100 can execute a detection process of clock frequency offset for the fan chip 10, so as to detect a clock frequency offset value 303 of the fan chip 10. The detection system 100 can adjust the internal frequency parameters set in the fan chip 10 based on the detected clock frequency offset value 303 so that the internal clock frequency of the fan chip 10 can be consistent with the original target clock frequency. Afterwards, when the fan chip 10 is operating in a fan operation mode, the frequency of the control command 101 sent from the fan chip 10 will be conforming to the target frequency, and thus the fan chip 10 can accurately control the fan 50 to operate at a predetermined rotational speed.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. A system for detecting clock frequency offset of fan chip, comprising:
   a fan chip comprising an input pin and an output pin;
   a control unit connected to the fan chip, wherein a target pulse width is defined in the fan chip and the control unit, respectively;
   wherein when the control unit is to execute a detection process of clock frequency offset for the fan chip, the control unit will generate a specific pattern pulse signal, and send the specific pattern pulse signal to the fan chip; the fan chip receives the specific pattern pulse signal via the input pin to enter a detection mode of clock frequency offset; when the fan chip is operated in the detection mode of clock frequency offset, the fan chip will generate a response signal including an actual target pulse width based on referring to the defined target pulse width, and send the response signal to the control unit via the output pin; afterwards, the control unit compares a difference between the actual target pulse width in the response signal and the defined target pulse width so as to detect a clock frequency offset value of the fan chip.

2. The system according to claim 1, wherein the specific pattern pulse signal is formulated with a specific number of pulses and a specific duty ratio of pulse.

3. The system according to claim 1, wherein the fan chip comprises a first firmware, the control unit comprises a second firmware, the target pulse width is defined in the first firmware of the fan chip and the second firmware of the control unit, respectively.

4. The system according to claim 1, wherein the fan chip comprises a first storage unit, the control unit comprises a second storage unit, the target pulse width is defined in the first storage unit of the fan chip and the second storage unit of the control unit, respectively.

5. The system according to claim 1, wherein when the control unit is to execute a fan operation process for the fan chip, the control unit will generate a fan operation pulse signal and send the fan operation pulse signal to the fan chip, the fan chip receives the fan operation pulse signal via the input pin to enter a fan operation mode according to the fan operation pulse signal; when the fan chip is operated in the fan operation mode, the fan chip will generate a corresponding control command that indicates a rotation speed according to a duty ratio of each of pulses in the fan operation pulse signal, and send each of the control commands to a fan by the output pin in sequence so that the fan is able to be operated in a predetermined rotation speed by the controlling of each of the control commands.

6. The system according to claim 5, wherein the fan chip comprises a first firmware or a comparison circuit, when the fan chip receives a pulse signal sent from the control unit, it will determine that the pulse signal is the fan operation pulse signal or the specific pattern pulse signal by the first firmware or the comparison circuit, and therefore decide to be operated in the fan operation mode or the detection mode of clock frequency offset.

7. The system according to claim 1, wherein the control unit is a controller, a processor, or a BIOS.

8. A method for detecting clock frequency offset of fan chip, comprising:
   defining a target pulse width in a fan chip and a control unit; and
   executing a detection process of clock frequency offset for the fan chip by the control unit, steps of the detection process of clock frequency offset comprising:
   generating a specific pattern pulse signal and sending the specific pattern pulse signal to the fan chip by the control unit;
   receiving the first pulse signal by the fan chip;
   enabling the fan chip to be operated in a detection mode of clock frequency offset according to the specific pattern pulse signal;
   enabling the fan chip to generate a response signal including an actual target pulse width based on referring to the defined target pulse width, and send the response signal to the control unit; and
   detecting a clock frequency offset value of the fan chip by the control unit comparing a difference between the actual target pulse width in the response signal and the defined target pulse width.

9. The method according to claim 8, wherein the control unit can further execute a fan operation process for the fan chip, steps of the fan operation process comprising:

generating a fan operation pulse signal and sending the fan operation pulse signal to the fan chip by the control unit;

enabling the fan chip to enter a fan operation mode when it receives the fan operation pulse signal; and enabling the fan chip to generate a corresponding control command that indicates a rotation speed according to a duty ratio of each of pulses in the fan operation pulse signal, and send each of the control commands to a fan so that the fan is able to be operated at a predetermined rotational speed by the controlling of each of the control commands.

10. The method according to claim 9, wherein the fan chip comprises a first firmware or a comparison circuit, the steps of the method further comprising:

receiving a pulse signal sent from the control unit by the fan chip; and determining that the pulse signal is the fan operation pulse signal or the specific pattern pulse signal by the first firmware or the comparison circuit.

* * * * *